United States Patent [19]

Chappell et al.

[11] Patent Number: 4,583,197
[45] Date of Patent: Apr. 15, 1986

[54] MULTI-STAGE PASS TRANSISTOR SHIFTER/ROTATOR

[75] Inventors: Barbara A. Chappell, Amawalk, N.Y.; Hung-Hui Hsieh, San Jose, Calif.

[73] Assignee: International Business Machines Corporation, Armonk, N.Y.

[21] Appl. No.: 509,740

[22] Filed: Jun. 30, 1983

[51] Int. Cl.⁴ .............................................. G06F 7/00
[52] U.S. Cl. ................................. 364/900; 364/715
[58] Field of Search ................................. 364/900, 715

[56] References Cited

U.S. PATENT DOCUMENTS

| | | | |
|---|---|---|---|
| 3,810,115 | 5/1974 | Stafford | 364/900 |
| 4,122,534 | 10/1978 | Cesaratto | 364/900 |
| 4,383,304 | 5/1983 | Hirashima | 364/715 |
| 4,396,994 | 8/1983 | Kang et al. | 364/900 |
| 4,472,788 | 9/1984 | Yamazaki | 364/900 |

OTHER PUBLICATIONS

Mead, "Introduction to VLSI Systems" Addison-Wesley, pp. 157-162, 1980.
Gersbach "Algebraic/Logical Shift Matrix" *IBM Tech. Disclosure Bulletin,* vol. 23, No. 1, Jun. 1980, pp. 120-122.
Gersbach, "High-Speed Shifter Array" *IBM Tech. Disclosure Bulletin,* vol. 21, No. 4, Sep. 1978, pp. 1379-1380.

*Primary Examiner*—David H. Malzahn
*Attorney, Agent, or Firm*—John J. Goodwin

[57] ABSTRACT

A digital shifter/rotator for shifting an input word by an amount depending on a shift control word is described. The shifter/rotator comprises an array of FET pass transistors arranged in a sequential number of stages. The amount to be shifted in each stage is controlled by a corresponding shift control bit of the shift control word, whereby the output word of the rotator is the input word shifted by an amount equal to a sum of the number of shifts effected in each of the stages as determined by the shift control word. The rotator features selectable amount of shift in one machine cycle, high performance and reduced device count. Further improved performance is obtained by utilizing decoupling devices for isolating the input points of the stages, except when providing rotation, from the long rotation cross buses and its associated large parasitic capacitances.

7 Claims, 7 Drawing Figures

MULTI-STAGE PASS TRANSISTOR SHIFTER/ROTATOR

1. Technical Field

This invention relates generally to a shifter/rotator for shifting an input word for an amount depending on a shift control word, and more particularly to a multi-stage shifter which is capable of also rotating the input word.

2. Background Art

In advanced microprocessor machines, means for shifting an input word many places, and having the capability also to rotate the input word in one machine cycle, or less, can be used to perform very powerful functions. Separately, in order to make maximum use of very large scale integration (VLSI) technology and its capability, the trend in processor design is towards more powerful operation codes and toward wider and wider operation code word widths. Accordingly, heretofore there has been an interest in shifters/rotators which can handle wide input word width, for instance 32-bit or more. The design criterion of interests, among other things, are speed performance, device count, power and clocking requirements.

Some early shift registers have a multi-stage configuration. For instance, U.S. Pat. No. 3,708,690 issued to J. O. Paivinen, entitled, "Shift Register" describes a multi-phase shift register having a plurality of parallel columns each comprising n stages. Another U.S. Pat. No. 3,893,088 entitled, "Random Access Memory Shift Register System, is directed to a RAM array wherein each storage cell includes an input, an output, a write control and a read control coupled to a commutator system, the RAM array is thereby operated by the commutator system to provide a shift register system.

Still, other prior shifters are capable of changing the bit order of a selected portion of an input word. As an example, U.S. Pat. No. 4,181,976, issued to M. J. Collins, et al., and entitled "Bit Reversing Apparatus" is directed to a shifter with bit reversing capability. According to the invention, a first shifter is provided to shift the position of the unselected portion of an input word to a set of terminals. The input word, in bit reverse order, is coupled to an adjacent set of terminals. The two sets of terminals are fed to a second shifter which couples to the output thereof the input word with the selected portion thereof in bit-reversed order.

Yet more recent shifters are capable of both shifting and rotating an input word. For instance, a barrel shifter shown and described on pp. 159 of a book by C. Mead, et al, and entitled, "Introduction to VLSI System" discloses a pass transistor array capable of both shifting and rotating an input word. According to the teaching of the this particular shifter/rotator disclosure, for an input word width of n, an implementation of the disclosed shifter/rotator utilizing pass transistors requires n×n devices. Also, with this particular implementation, if a binary encoded shift control word is the input, as is the case in typical machine designs, then a large decoder is required to provide the signal for driving the array, since the shift control word need to be n bits wide.

DISCLOSURE OF INVENTION

It is a principal object of the present invention to provide an improved shifter array which is also capable of rotating an input word.

It is another principal object of the present invention to provide a multi-stage rotator having a high performance, and having also a compact array size and a reduced device count.

It is another object of the present invention to provide a multi-stage rotator, wherein rotation cross buses having large parasitic capacitances are effectively isolated from the input, except when providing rotation.

It is still another object of the present invention to provide a multi-stage rotator that requires no decoding of a binary-encoded shift control word.

It is also another object of the present invention to provide a multi-stage rotator which has no complex clocking requirement.

It is also an object of the present invention to provide a multi-stage rotator comprising a high density array of pass transistors.

It is yet another object of the present invention to provide a rotator which is capable of shifting and rotating an input word many places in one machine cycle.

These and other objectives of the present invention can be achieved by way of a multi-stage shifter/rotator, herein referred to as the "rotator", for shifting an input word for an amount depending on a shift control word, comprising: a number of sequential stages having at least a first stage for receiving said input word wherein the output of said first stage is connected to the input of the immediate subsequent stage, the output of said immediate subsequent stage being connected to the input of the next immediate subsequent stage, and a last stage for producing an output word; each of said stages being controlled by a corresponding bit of said shift control word; and each of said stages shifts said input word by an amount equal to the numerical representation of said corresponding bit of said shift control word, whereby said output word is the input word shifted by an amount equal to a sum of the number of shifts effected in each of said stages as determined by said shift control word. The number of shifts per stage and the number of stages can be chosen so that no decoding of a binary encoded shift control word is needed, and no decoder delay is experienced.

According to another aspect of the present invention, Applicants' novel multi-stage rotator as set forth above, particularly includes a plurality of pass-transistor shift cells in each stage, some of said stages may include a decoupling transistor having a drain electrode connected to an input point of one of such cells, a source electrode connected to a rotation cross-bus, and a gate electrode connected to the complement of the corresponding bit of the shift control word, thereby effecting isolation of the input point of the cell from the rotation cross-bus, except when effecting rotation thereof.

The nature, principle and utility of the present invention will be better understood from the hereinafter detailed description of the invention when read in conjunction with the accompanying drawings.

BRIEF DESCRIPTION OF THE DRAWINGS

Details of the invention will be described in connection with the accompanying drawings, in which.

DESCRIPTION OF THE PREFERRED EMBODIMENT

Figure 1:
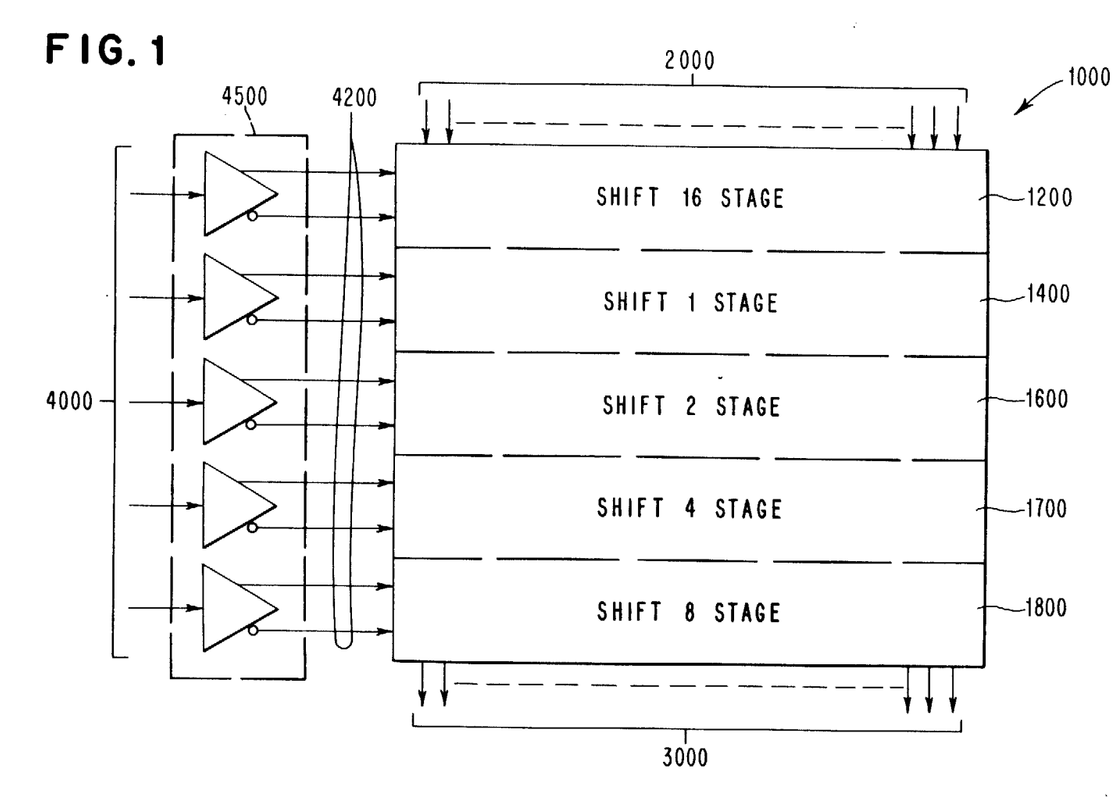
FIG. 1 is a functional diagram of a five-stage rotator array for shifting a 32-bit input word with a 5-bit shift control word and is the preferred embodiment in accordance with the present invention.

Referring first to FIG. 1, a multi-stage rotator 1000 for shifting an input word 2000 for an amount controlled by a shift control word 4000 on conductors 4200 in accordance with the present invention includes at least a first stage 1200 for receiving the input word 2000. The output of the first stage 1200 is connected to the input of the immediate subsequent stage 1400. The output of the immediate subsequent stage 1400 is connected to the input of the next immediate subsequent stage 1600, and so on. The rotator 1000 may also includes a last stage 1800 for producing an an output word 3000.

The multi-stage rotator 1000 is, according to the present invention, capable of shifting the input word 2000 may places in one machine cycle. In contrast to more conventional shift registers and rotators, which require complex multi-phase clockings, the rotator 1000 in accordance with the present invention does not require any clocking. The disclosed rotator 1000 offers improved delay, reduced device count even for very wide data paths (an input word 2000 having many bits), and low power.

Figure 2:
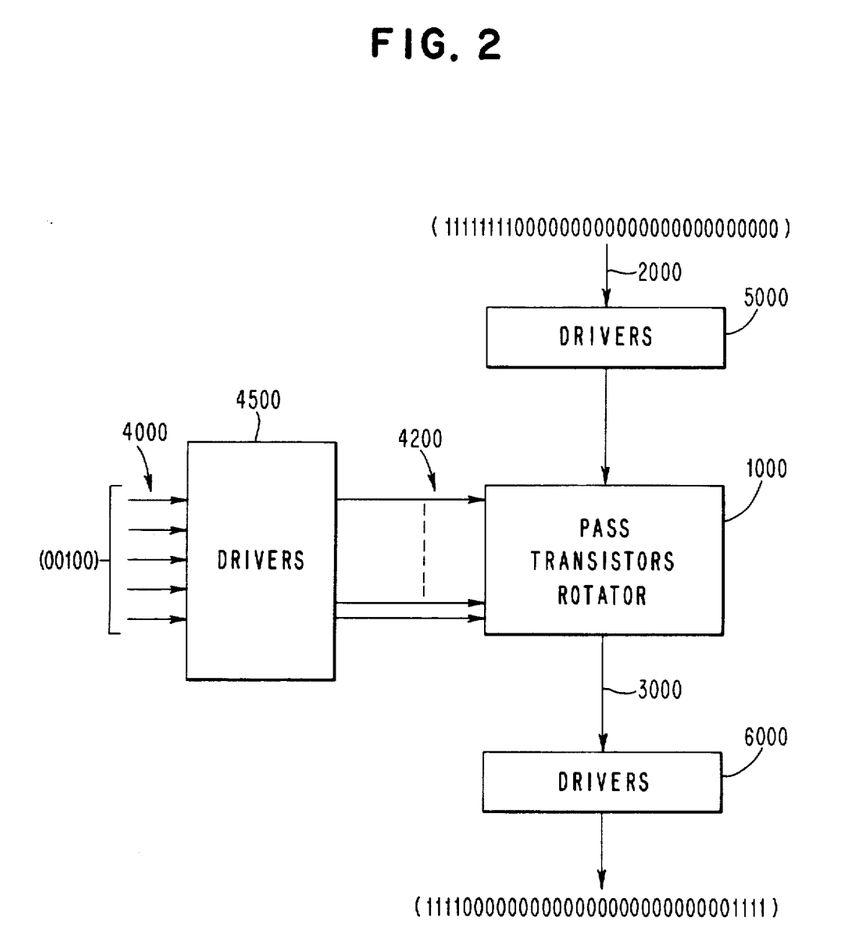
FIG. 2 is a block diagram showing the five-stage rotator of FIG. 1 together with its associated circuits illustrating a shift/rotate operation.

An exemplary embodiment of the multi-stage rotator 1000 in FIG. 1 together with its associated circuits for shifting and rotating is shown in block diagram form in FIG. 2. The multi-stage rotator 1000 is an array comprising 320 pass transistors plus 15 decoupling devices (more detailed description to be provided hereinafter in conjunction with FIG. 7) and being arranged in five stages. The input word 2000 can be buffered by drivers 5000, and similarly, output word 3000 may also be buffered by drivers 6000. Shift control word 4000 can be buffered by driver 4500, which also provides a complementary shift control word output on conductor lines 4200, together with a buffered shift control word output on conductor lines 4200 for controlling the pass transistor rotator 1000. Referring to FIG. 2, the 32-bit input word 2000 having a binary value of

11111111000000000000000000000000 is first buffered by drivers 5000, and then presented to the input of rotator 1000, which shifts and rotates the input word 2000 four places to the left in accordance with the shift control word 4000 having a binary value of

00100

The shift control word 4000 is buffered by drivers 4500 which also provides a complementary shift control word, together with the shift control word 4000, on conductors 4200 for driving the rotator 1000. In accordance with the present invention, an output word 3000 having a binary value of

11110000000000000000000000001111 and being buffered by driver 6000 is provided by rotator 1000 under the control of shift control word 4000.

Figure 3:
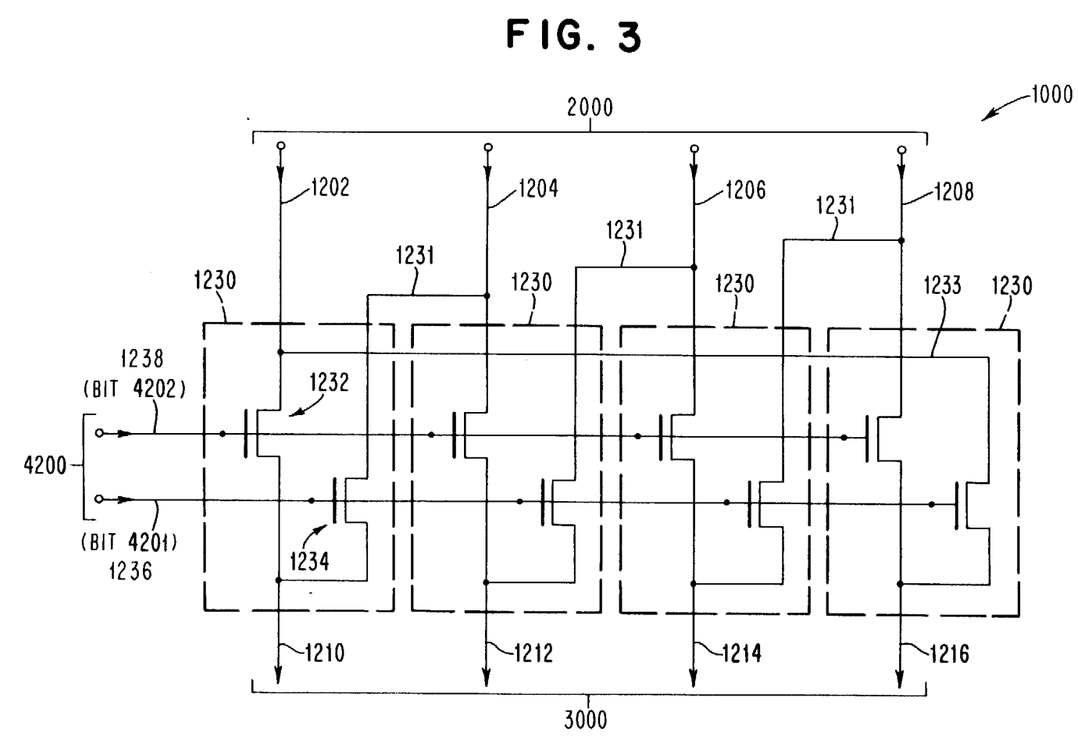
FIG. 3 is a one-stage, shift-one, simplified four-bit rotator showing also a basic shift cell.

While the rotator 1000 design is most advantageous when used in a wide data path application, i.e., an input word 2000 having many bits, a simple four-bit wide one stage rotator 1000 shown in FIG. 3 is useful for the purpose of, and a good starting point for explaining the present invention. Referring to FIG. 3, the simplified one stage rotator 1000 can shift and rotate a four bit input word 2000 one place to the left or pass the input word 2000 straight through unchanged, depending on the shift control word 4000, more particularly in this case the shift control bit 4201, and its complement 4202. Each bit of the input word 2000, for instance the most significant bit (MSB), is connected to a shift cell 1230 by way of input points 1202 (1204, 1206, etc., hereinafter referred to as the "corresponding input point").

Referring to FIG. 3, each of the shift cells 1230, for instance, the one associated with the MSB, has an input for connection to a corresponding input point (1202, 1204 etc) and an output for connection to an output point 1210 (1212, 1214, etc., hereinafter referred to as the "corresponding output point"), and input lines 1236 and 1238 for connection to the shift control bit 4201 (hereinafter referred to as the "corresponding shift control bit") and its complement 4202, respectively.

Each of the shift cells 1230 comprises a first pass transistor 1232 having its drain electrode connected to the corresponding input point, a source electrode connected to the corresponding output point, and a gate electrode connected to the complement of the corresponding shift control bit, and a second pass transistor 1234 having a source electrode connected to the corresponding output point, a gate electrode connected to the corresponding shift control bit of the shift control word 4000, and a drain electrode connected, by way of a cross bus 1231, to the next lower order bit input point (for instance, for the shift cell 1230 associated with the MSB, to the next lower order bit input point 1204). In a shift operation, depending on the shift control word 4000, each bit of the input word 2000 with either be shifted one place to the left, by way of pass transistor 1234, or passed straight through by way of pass transistor 1232, to the corresponding output point for producing the output word 3000. As used here and hereinafter, the term "pass transistor" generally refers to a device which is used to propagate either a high or a low potential whenever the device is turned-on (for instance, by taking the gate to a high potential for a n-type device or to a low potential for a p-type device). Therefore, the terminal which is the drain for the case when a high is being propagated will become the source when a low is being propagated. The device is also expected to be a switch in that when it is cut-off, no signal is propagated between its drain and source—e.g., an enhancement MOS FET.

Figure 4:
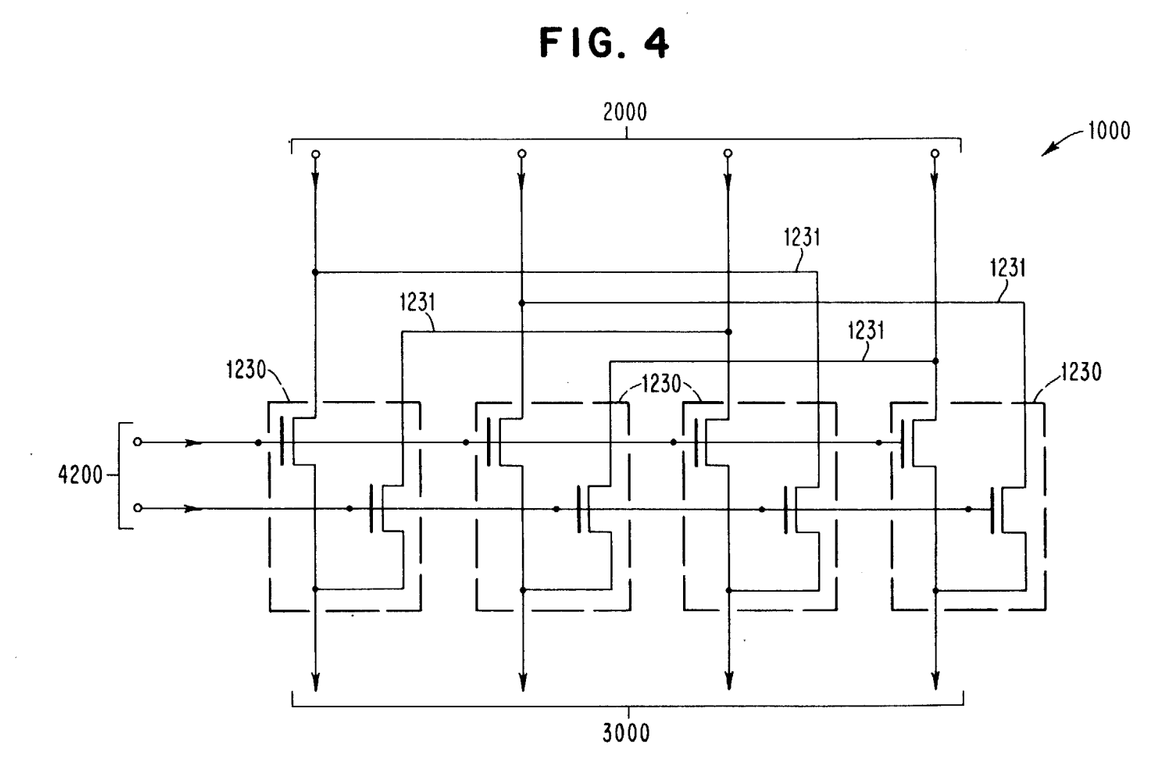
FIG. 4 is a one-stage, shift-two, simplified four-bit rotator for the purposes of explaining the present invention.

An expansion of the exemplary one stage rotator 1000 of FIG. 3, according to the present invention, to accommodate a wider input word 2000 is accomplished by adding an additional one cell 1230 for each added bit of the wider input word 2000. A larger shift amount, according to the present invention, can be provided by extending the cross-buses 1231 across more shift cells 1230 instead of across one cell. For instance, by connecting the cross buses across two shift cells 1230, as illustrated in FIG. 4, rotator 1000 can be made to shift the input word 2000 to the left by either two places or straight through. Likewise, by connecting the cross buses 1231 across four shift cells 1230, eight shift cells 1230, or sixteen shift cells 1230 a shift-four stage, a shift-eight stage, or a shift-sixteen stage, respectively, can be formed.

Figure 5:
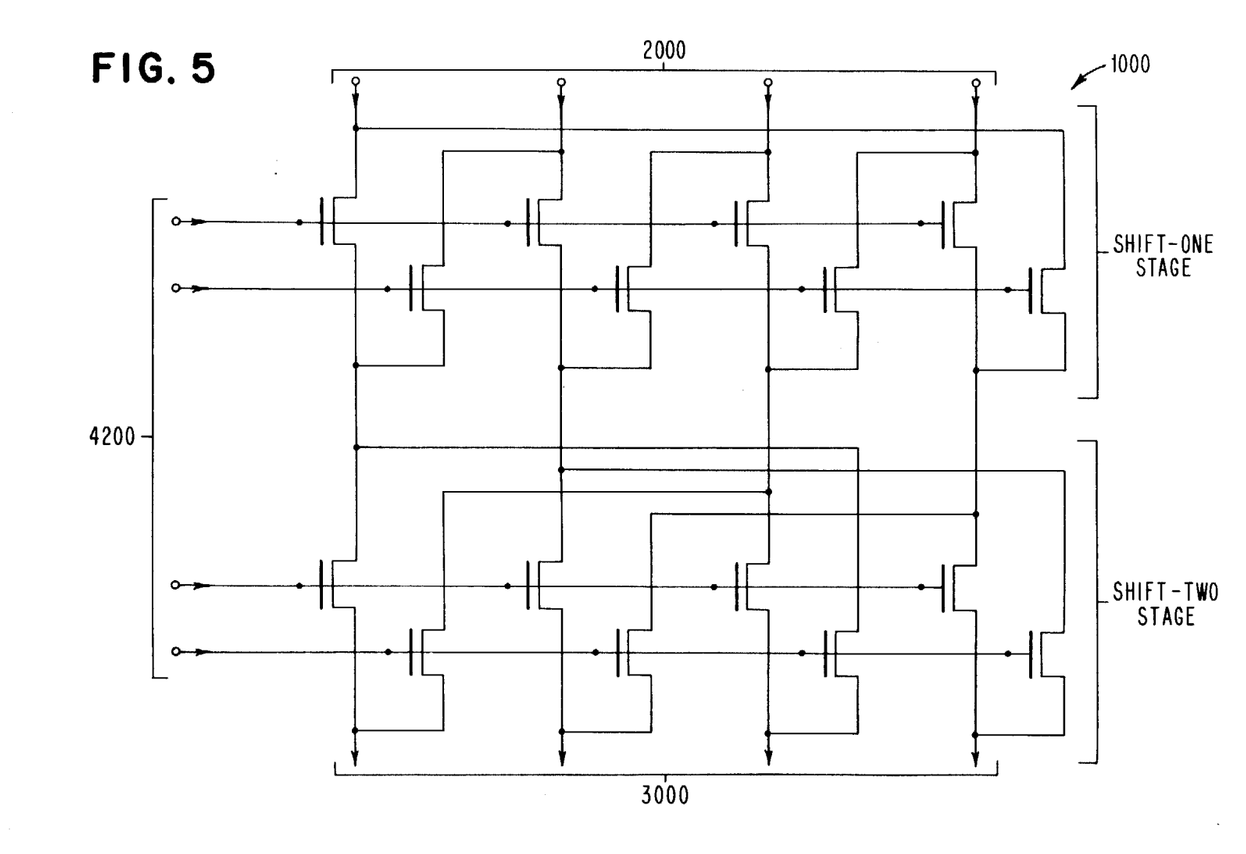
FIG. 5 is a two-stage, four-bit rotator by connecting the two rotators of FIGS. 3 and 4 in series.

In accordance with the present invention, to further increase the shift amount, stages for shifting a different amount can be connected in series as illustrated in FIG. 5, with a corresponding shift control bit of the shift control word 4000 controlling one stage of the rotator 1000. With a multi-stage rotator 1000, any shift amount from zero to the full width of the shift control word 4000 can be performed if the proper number of stages and shift amount per stage are provided. More specifically, in the multi-stage rotator 1000 according to the present invention, the minimum number of stages required equals to the log, base two, of the width of the input word 2000. In order to use a binary encoded shift control word 4000, each stage of such a rotator is wired, by means of cross-bus connections 1231, to shift two to the n increments where n is an integer such as 1, 2, 3. For instance, the rotator 1000 in FIG. 5 is the shift-two stage of FIG. 4 added in series with a shift-one stage of FIG. 3. Accordingly, this rotator 1000 can shift the input word 2000 to the left, under the control of the shift control word 4000, any number of times from zero to three places.

Figure 6:
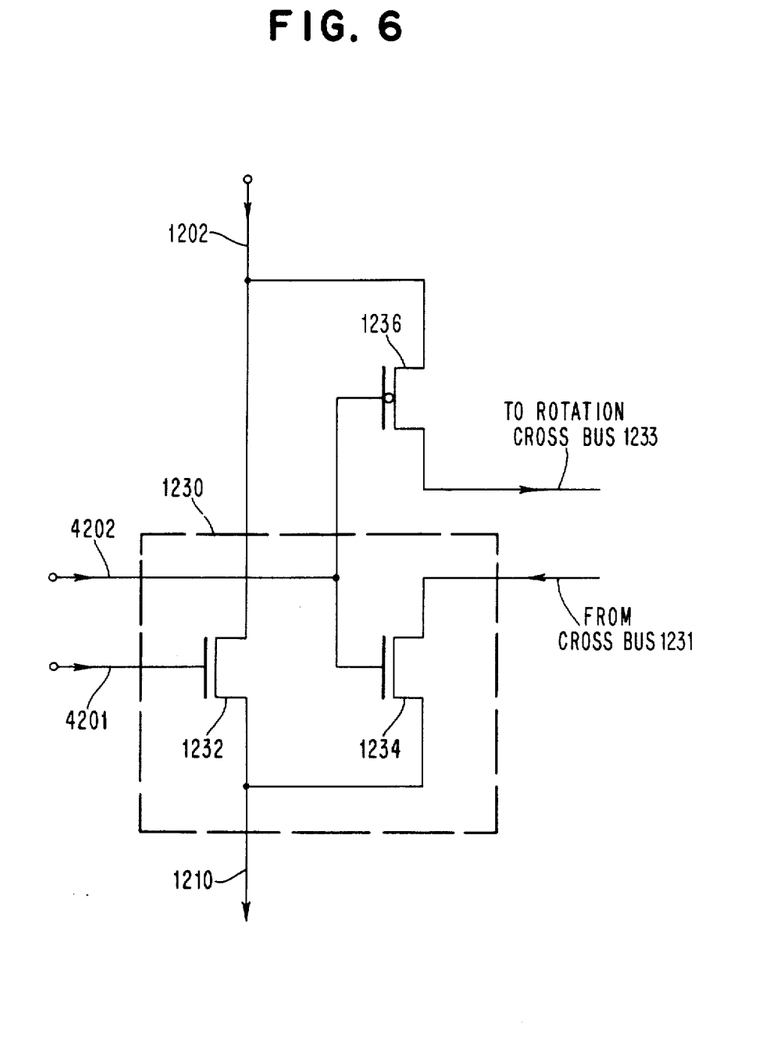
FIG. 6 is an illustration of the shift cell of FIG. 3 augmented with a decoupling transistor for purposes of isolating the rotation cross bus.

Referring back to FIG. 3, shifting, or rotation of the left-most bit, i.e., the MSB of the input word 2000 at the corresponding input point 1202 to the right most output point 1216 is achieved by way of the rotation cross bus 1233. In actual design layout, rotation cross bus 1233 is a long connecting conductor which runs across substantially all the shift cells 1231 so as to provide the interconnection between the input point 1202 and output point 1216. In an MOS technology, for example, such a rotation cross bus 1233 can either by a polysilicon conductor line, a metal line, or a diffusion lines. In either case, rotation cross bus 1233 is loaded with a large parasitic capacitance which tends to substantially slow down the overall operation of the rotator 1000. According to the present invention, a decoupling device 1236 can be utilized to improve the delay caused by the large parasitic capacitance associated with the long rotation cross bus. Referring to FIG. 6, The decoupling device 1236, preferably a zero threshold FET transistor, has its drain electrode connected to input point 1202, its source electrode connected to the rotation cross bus 1233, and its gate electrode connected to the complement of the corresponding shift control bit 4201, thereby effecting isolation of the rotation cross bus 1233, except when providing rotation. This selective isolation is achieved by having the decoupling transistor 1236 switched off substantially all the time, except when the gate electrode potential is high. Since the decoupling device is not necessary to the logical function of the rotator, it is not essential that it be completely cut-off when the stage is not shifting; consequently, for an FET implementation, the device need not be enhanced mode but would preferably have a threshold around zero or could even have a negative threshold (i.e., be a depletion mode device).

Figure 7:
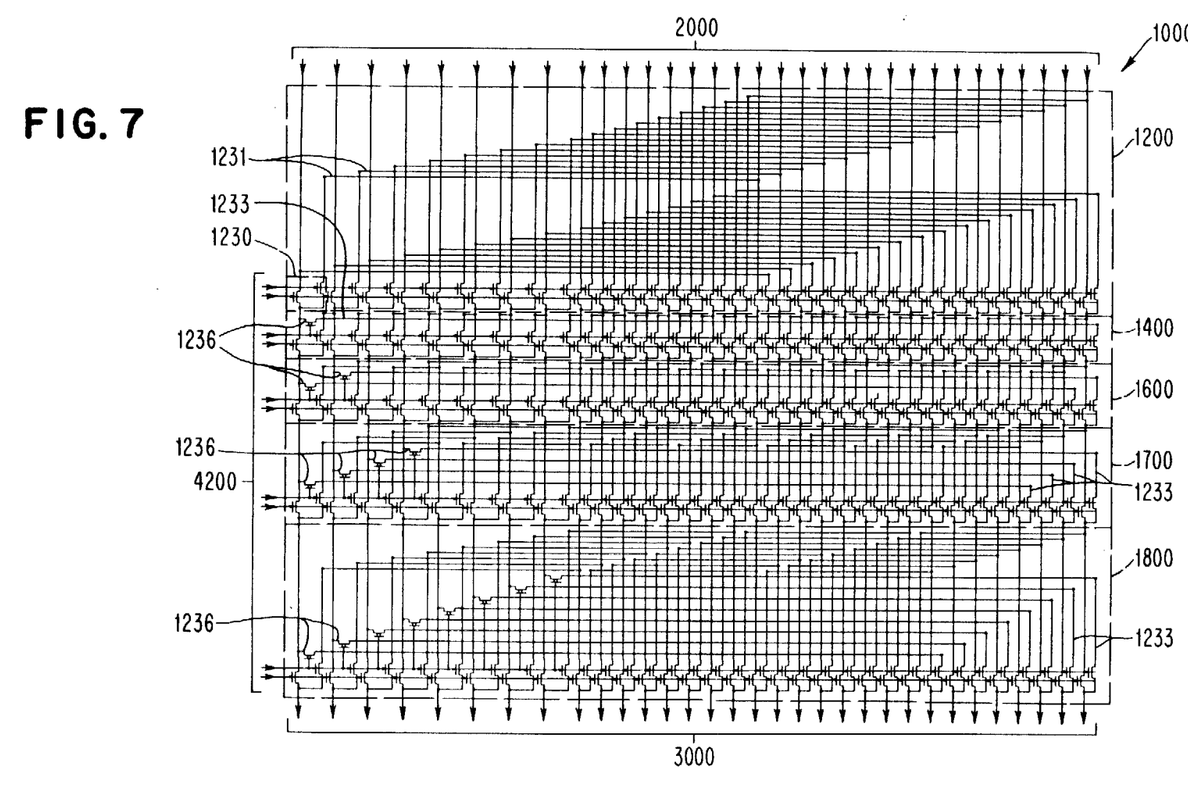
FIG. 7 is a detailed drawing showing the rotator array of FIG. 1 for shifting a 32-bit input word with a 5-bit shift control word input, implemented using pass transistors and incorporating the decoupling transistor illustrated in FIG. 6.

Referring back to FIG. 1, the preferred embodiment of the multi-stage rotator 1000 is a five-stage thirty-two bit array of pass transistors using a five-bit shift control word 4000 and its complement. The detailed implementation of this five-stage preferred embodiment is shown in FIG. 7. The multi-stage rotator 1000 for shifting an input word 2000 for an amount controlled by a shift control word 4000 and its complement on conductors 4200 in accordance with the present invention includes a stage 1200 for receiving the input word 2000. The output of stage 1200 is connected to the input of the immediate subsequent stage 1400. The output of the immediate subsequent stage 1400 is connected to the input of the next immediate subsequent stage 1600. The output of stage 1600 is connected to the input of stage 1700, the output of which is connected to the input of a last stage 1800 for producing an an output word 3000.

Stage 1200 is a shift-sixteen stage. In accordance with the teaching of the present invention herein, the cross bus 1231 associated with each shift cell 1230 is connected across sixteen shift cells 1230 to an input point, thereby achieving a shift/rotate sixteen places operation in stage 1200. The immediate subsequent stage 1400 is a shift-one stage wherein the cross bus 1231 associated with each shift cell 1230 is connected to the corresponding input point of the next lower order bit shift cell 1230. As described hereinabove the decoupling device 1236 is utilized to effectively isolated the large parasitic capacitances associated with the long rotation cross bus 1233 from the corresponding input point. Stages 1600, 1700, and 1800 are, respectively, shift-two, shift-four, and shift-eight stages, each incorporating two, four, and eight decoupling devices and rotation cross-buses, respectively. The rotation cross-buses extend from the right-most set of cells to the left-most set of cells in each stage, to effect rotation thereof. More specifically, a particular rotation cross bus interconnects a drain electrode of the second pass transistor of one of the left-most set of shift cells to an input point of one of the right-most cells. As stated hereinabove, which input point to be interconnected depends on the number of shifts to be effected and assigned to the particular stage. The number of rotation cross buses required in each set are two, four, and eight for the shift-two, shift-four, and shift-eight stages, respectively. In accordance with the teachings of this invention as already described, the remaining cross-buses extend across two cells each in the shift-two stage, four cells each in the shift-four stage, and eight-cells each in the shift-eight stage. The shift amount per stage and the number of stages have been chosen so that the shift control word 4000 may be a five-bit binary encoded word and its complement, with no decoding required.

The 32-bit rotator array 1000 preferred embodiment is capable of shifting and rotating a 32-bit input word 2000 from 0 to 31 places as illustrated in FIG. 2. Rotator 1000 represents a substantial design improvement in that the present rotator 1000 only requires an array of 335 pass transistors in contrast to a comparable conventional rotator which requires 1024 transistors. In addition, no delay is required for decoding the shift control input word since the binary encoded amount and its complement are used directly to drive the array. A particular implementation of the rotator 1000 shown in FIG. 7 in an FET technology having two layers of wiring, and a minimum feature size of 1.25 micrometer results in a rotator 1000 with a 15 ns nominal delay, a 32 mW worst case power, and a total silicon area of about 0.191 sq. mm with the power, delay and area numbers all including that needed for both the array and the required drivers 4500, 5000, and 6000.

It should be particularly noted that the multi-stage rotator 1000 has no particular timing requirements, more specifically, multi-phase clockings, as required in conventional shift registers, are not required in the rotator 1000 in accordance with the present invention. However it should be noted that if a precharge clock is available, or arranged, precharging of the rotary array 1000, and conditional discharging only to propagate zeros could be adapted to provide further improvements in delay.

While each preceding stage of the multi-stage rotator 1000 is shown and described to have its output directly feeding the input of the immediate subsequent stage, this connections need not be direct. For instance, driver circuits can easily be added between stages to further improve the delay, and or to provide signal level restoration, if necessary. Although the present preferred embodiment specifically calls for an array implementation using FET pass transistors, it is clear that other switching array implementations such as bipolar transistors, or other devices having similar switching characteristics are also possible.

The preferred embodiment described herein is wired to directly use a binary encoded shift control word 4000, which is preferred in typical computing machine designs. However, referring to FIG. 3, each shift cell 1230 could be enlarged to include additional parallel devices connected to additional control input lines 4200 and additional cross-buses 1230 or 1233. In this way, each stage could be wired to shift several different amounts. For example, a 32-bit rotator 1000 of three stages could be implemented with the first stage consisting of four devices per shift cell 1230 and shifting zero, eight, sixteen, or twenty-four; the second stage consisting of four devices per cell and shifting zero, one, two, or three; and the third stage consisting of two devices shifting zero and four. Relative to the preferred embodiment, this implementation has the same device count while requiring fewer stages to be placed in series, but does not require decoding of a binary encoded shift control word 4000 for driving the rotator array 1000. For machine designs wherein the decoding would not be in the critical path, an implementation with fewer stages may be preferable.

From the preceding detailed description of applicants' invention, it is seen that rotators having features in accordance with the teachings of the present invention have advantages heretofore not achievable. In addition to the variations and modifications to applicants' disclosed apparatus which have been suggested, many other variations and modifications will be apparent to those skilled in this art, and accordingly, the scope of applicants' invention is not to be construed to be limited to the particular embodiments shown or suggested.

We claim:

1. A multi-stage rotator for shifting an input word for an amount depending on a binary encoded shift control word, comprising:
    a number of sequential stages having at least a first stage for receiving said input word and a plurality of subsequent sequential stages wherein the output of said first stage is connected to the input of the immediate subsequent stage of said sequential stages, the output of said immediate subsequent stage being connected to the input of the next immediate subsequent stage of said sequential stages and a last stage for producing an output word;
    each of said stages being controlled by a corresponding bit of said binary encoded shift control word; and
    each of said stages shifts said input word by an amount equal to the numerical representation of said corresponding bit of said binary encoded shift control word,
    each of said stages is a pass-transistor shifter including a number of shift cells, each of said shift cells having an input point for receiving a corresponding bit of said input word and an output point, each of said shift cells including a first pass transistor for providing a through path, said first pass transistor having a drain electrode connected to said input point, a source electrode connected to said output point, and a gate electrode connected to a corresponding bit of said shift control word; and
    a second pass transistor having a source electrode connected to the output point, a gate electrode connected to the complement of said corresponding bit of said shift control word, and a drain electrode connected, by way of a cross-bus, to an input point of another of said shift cell in said each of said stages, which input point of another of said shift cell depends on the number of shifts assigned to said each of said stage to effect shifting of said input word in said each of said stages wherein said drain electrode of said second pass transistor of one of the left-most shift cells is connected to an input point of one of the right-most shift cells by way of a rotation cross-bus, thereby effecting rotation whereby said output word is an input word shifted by an amount equal to a sum of the number of shifts effected in each of said stages as determined by said binary encoded shift control word, and wherein a decoupling transistor having a drain electrode connected to said input point of one of the left-most shift cells and a source electrode connected to said rotation cross-bus, and a gate electrode connected to the complement of said corresponding bit of said shift control word, thereby effecting isolation of said input point of one of said left-most shift cells from said rotation cross-bus, except when effecting rotation thereof.

2. A multi-stage rotator as set forth in claim 1, wherein said first and second pass transistors are enhancement mode FETs.

3. A multi-stage rotator as set forth in claim 2, wherein said decoupling transistor is a zero threshold FET.

4. A multi-stage rotator as set forth in claim 1, wherein said rotator has five sequential stages, and wherein said first stage is a shift-sixteen stage, said immediate subsequent stage is a shift-one stage, said next immediate subsequent stage is a shift-two stage, followed by a shift-four stage, and said last stage is a shift-eight stage.

5. A multi-stage rotator as set forth in claim 4, wherein said shift control word has five bits, and said input word has thirty-two bits.

6. A multi-stage rotator as set forth in claim 5, wherein said first and second pass transistors are enhancement mode FETs.

7. A multi-stage rotator as set forth in claim 6, wherein said decoupling transistor is a zero threshold FET.

* * * * *